(12) United States Patent
Wu et al.

(10) Patent No.: US 9,934,827 B2
(45) Date of Patent: Apr. 3, 2018

(54) DRAM DATA PATH SHARING VIA A SPLIT LOCAL DATA BUS

(71) Applicant: INTEL CORPORATION, Santa Clara, CA (US)

(72) Inventors: Wei Wu, Portland, OR (US); Shigeki Tomishima, Portland, OR (US); Shih-Lien L. Lu, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 75 days.

(21) Appl. No.: 14/975,298

(22) Filed: Dec. 18, 2015

(65) Prior Publication Data

US 2017/0178697 A1   Jun. 22, 2017

(51) Int. Cl.
| | |
|---|---|
| G06F 13/00 | (2006.01) |
| G11C 7/06 | (2006.01) |
| G06F 13/16 | (2006.01) |
| G06F 13/42 | (2006.01) |
| G06F 13/40 | (2006.01) |
| G11C 7/10 | (2006.01) |
| G11C 11/406 | (2006.01) |

(52) U.S. Cl.
CPC ............ *G11C 7/06* (2013.01); *G06F 13/1678* (2013.01); *G06F 13/4018* (2013.01); *G06F 13/4282* (2013.01); *G11C 7/1072* (2013.01); *G11C 11/40618* (2013.01)

(58) Field of Classification Search
CPC .......................... G06F 13/1678; G06F 13/4018
See application file for complete search history.

(56) References Cited

U.S. PATENT DOCUMENTS

| | | | |
|---|---|---|---|
| 5,822,261 A | 10/1998 | Suh | |
| 5,831,924 A | 11/1998 | Nitta et al. | |
| 6,144,577 A | 11/2000 | Hidaka | |
| 6,442,078 B1 * | 8/2002 | Arimoto | G11C 7/10 365/189.08 |
| 6,754,120 B1 | 6/2004 | Bellows et al. | |
| 6,825,836 B1 | 11/2004 | Stewart et al. | |
| 2002/0054525 A1 | 5/2002 | Eto et al. | |
| 2004/0073745 A1 | 4/2004 | Ma et al. | |
| 2004/0170075 A1 | 9/2004 | Suh | |

(Continued)

FOREIGN PATENT DOCUMENTS

WO   20060019870   2/2006

OTHER PUBLICATIONS

International Search Report and Written Opinion for International Application No. PCT/US2016/062834, dated Mar. 3, 2017, 16 pp.

(Continued)

*Primary Examiner* — Zachary K Huson
(74) *Attorney, Agent, or Firm* — Konrad Raynes Davda & Victor LLP; Rabindranath Dutta

(57) ABSTRACT

Provided is memory device and a memory bank, comprising a global data bus, and a local data bus split into two parts, wherein the local data bus is configurable to direct signals to the global data bus. Provided also is a method in which signals are received in a local data bus that is split into two parts, and the signals are directed from the local data bus to the global data bus. Provided also is a computational device comprised of a processor and the memory device.

25 Claims, 6 Drawing Sheets

(56) References Cited

U.S. PATENT DOCUMENTS

| | | | |
|---|---|---|---|
| 2005/0047255 A1 | 3/2005 | Park et al. | |
| 2005/0289409 A1* | 12/2005 | Smola | G06F 21/85 714/712 |
| 2007/0071130 A1 | 3/2007 | Saito et al. | |
| 2007/0073980 A1 | 3/2007 | Chung | |
| 2008/0048727 A1 | 2/2008 | Yuan et al. | |
| 2008/0278991 A1 | 11/2008 | Kajigaya | |
| 2008/0291763 A1 | 11/2008 | Mori et al. | |
| 2009/0019199 A1 | 1/2009 | Chun | |
| 2012/0284552 A1* | 11/2012 | Archer, Jr. | G06F 1/3203 713/324 |
| 2013/0337646 A1 | 12/2013 | Cernea et al. | |

OTHER PUBLICATIONS

International Search Report and Written Opinion for International Application No. PCT/US2016/062849, dated Mar. 9, 2017, 12 pp.

International Search Report and Written Opinion for International Application No. PCT/US2016/062853, dated Mar. 9, 2017, 13 pp.

Davis, B.T., "Modem DRAM Architectures", Dissertation, University of Michigan, 2001, 236 pp.

JEDEC Solid State Technology Association, "DDR4 SDRAM", JEDEC Standard, JESD79-4, Sep. 2012, 214 pp.

JEDEC Solid State Technology Association, "High Bandwidth Memory (HBM) DRAM", JEDEC Standard, JESD235, Oct. 2013, 124 pp.

JEDEC Solid State Technology Association, "Low Power Double Data Rate 4 (LPDDR4)", JEDEC Standard, JESD209-4, Aug. 2014, 196 pp.

JEDEC Solid State Technology Association, "Wide I/O 2 (WideIO2)", JEDEC Standard, JESD229-2, Aug. 2014, 116 pp. [Submitted as Parts A, B, and C due to EFS-Web file size restrictions].

Techopedia, "Dynamic Random Access Memory (DRAM)", [online], [Retrieved on Nov. 20, 2015], Retrieved from the Internet at <URL: https://www.techopedia.com/definition/2770/dynamic-random-access-memory-dram>, 2 pp.

Yoo, J., et al., "A 32-Bank 1 GB Self-Strobing Synchronous DRAM with 1 GByte/s Bandwidth", IEEE Journal of Solid-State Circuits, vol. 31, No. 11, Nov. 1996, 10 pp.

U.S. Appl. No. 141975,293, "DRAM Data Path Sharing Via a Split Local Data Bus and a Segmented Global Data Bus", by W. Wu et al., filed Dec. 18, 2015, 39 pp.

U.S. Appl. No. 14/975,305, "DRAM Data Path Sharing Via a Segmented Global Data Bus", by W. Wu et al., filed Dec. 18, 2015, 32 pp.

Office Action 1 for U.S. Appl. No. 14/975,305, dated Aug. 2, 2017, 20 pp.

Office Action 1 for U.S. Appl. No. 14/975,293, dated Jul. 25, 2017, 25 pp.

Response to Office Action 1 for U.S. Appl. No. 14/975,293, dated Oct. 25, 2017, 10 pp.

Response to Office Action 1 for U.S. Appl. No. 14/975,305, dated Nov. 2, 2017, 9 pp.

Notice of Allowance 1 for U.S. Appl. No. 14/975,293, dated Jan. 12, 2018, 17 pp. [77.333 (NOA1)].

Final Office Action 1 for U.S. Appl. No. 14/975,305, dated Jan. 23, 2018, 14 pp. [77.326 (FOA1)].

* cited by examiner

DRAM DATA PATH SHARING VIA A SPLIT LOCAL DATA BUS

BACKGROUND

Dynamic Random Access Memory (DRAM) is a data storage device that is used in many different types of computational devices. Some DRAM chips are comprised of rectangular arrays of memory cells referred to as banks. Each bank has support logic that is used for reading and writing data in the bank, and refresh circuitry to maintain the integrity of the data stored in the bank. The banks may operate independently but may share command, address, and data pins. Each bank may be comprised of a hierarchical structure with rectangular arrays of memory cells. The contents stored in memory cells are addressed via word lines and bit lines. The intersection of a word line and a bit line constitutes the address of a memory cell.

BRIEF DESCRIPTION OF THE DRAWINGS

Referring now to the drawings in which like reference numbers represent corresponding parts throughout.

DETAILED DESCRIPTION

Figure 1:
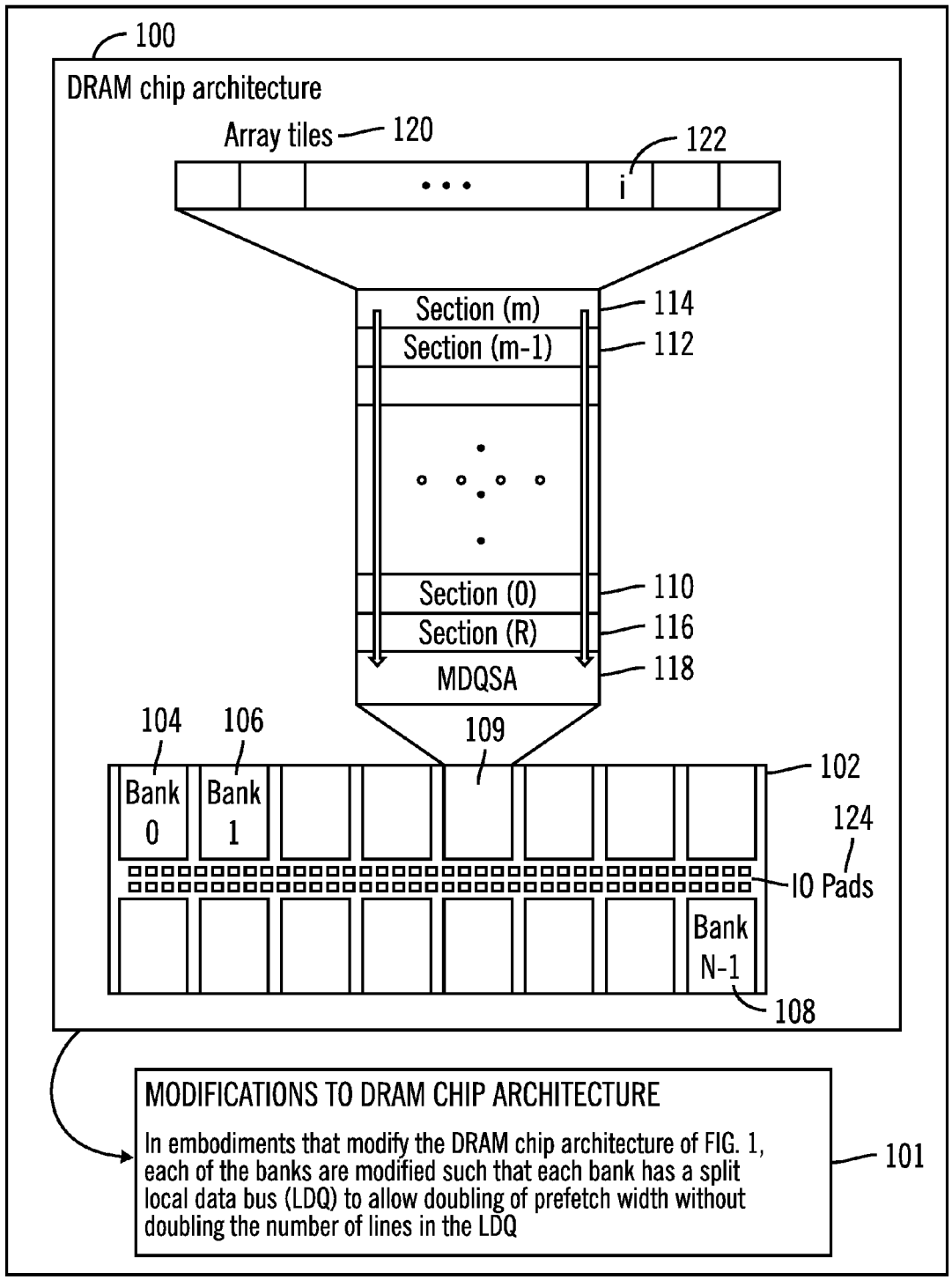
FIG. 1 illustrates a block diagram of a DRAM chip architecture and certain modifications to the DRAM chip architecture, in accordance with certain embodiments.

In certain DRAM chip architectures, when cells are sensed by bitline sense amplifiers, the sensed values are propagated to a local data bus, and then they are propagated through switches to a global data bus. The two data buses may extend in orthogonal directions and across an entire bank of the DRAM chip.

As the workload and speed of computer systems increase, higher bandwidth may be desirable in DRAMs. For increasing the bandwidth of DRAMs, certain embodiments address the routing of global input/output (IO) and local IO within the DRAM architecture. Although various embodiments are described with respect to DRAM, embodiments can be applied to any memory devices or devices that propagate values.

One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WI/O 2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include memory devices that use chalcogenide phase change material (e.g., chalcogenide glass), multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, a spintronic magnetic junction memory based device, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

In certain embodiments, the data prefetch width is doubled for a DRAM without changing the number of lines in the local data bus. The local data bus is physically split into two parts, and two column selects are used to direct one part of the signals to one direction along the local data bus, and the other part of the signals to another direction along the local data bus. In certain embodiments implemented in a DRAM the local data bus is referred to as LDQ. The LDQ is physically split into two sub-LDQs, while physically sharing the original LDQ tracks. Data from the left part of the split LDQ proceeds to the left to proceed to the global data bus, and data from the right part of the split LDQ proceeds to the right to proceed to the global data bus. In some cases, the LDQ can be split into two halves, although other divisions can be used.

In the following description, reference is made to the accompanying drawings which form a part hereof and which illustrate several embodiments. It is understood that other embodiments may be utilized and structural and operational changes may be made.

FIG. 1 illustrates a block diagram that shows a DRAM chip architecture 100 and certain modifications to the DRAM chip architecture (shown via reference numeral 101), in accordance with certain embodiments. The organization of memory banks in the DRAM chip architecture 100 is shown in a DRAM chip 102. The DRAM chip 102 is comprised of a plurality of banks numbered from 0 to (N−1), where Bank 0, Bank 1, and Bank 'N−1' are shown via reference numerals 104, 106, 108 respectively.

Each bank is comprised of a plurality of sections that may be referred to as sub-banks or sub-arrays. In FIG. 1, an exemplary bank 109 is shown to have sections 0 . . . , (m−1), m, wherein section 0, section (m−1), and section (m) are shown via references numerals 110, 112, 114 respectively. In addition to the sections 0 . . . m−1, m, the bank 109 is also comprised of a redundant section (R) 116 and circuitry for a main data queue sense amplifier (MDQSA) 118, where the MDQSA is a global sense amplifier that senses and amplifies signals.

Each of the sections 110 . . . 114 are comprised of a plurality of array tiles 120, where an exemplary array tile 'i' is shown via reference numeral 122. Block 101 of FIG. 1 shows certain modifications that may be made to the DRAM chip architecture 100. In certain embodiments that modify the DRAM chip architecture 100 (the modifications are indicated via reference numeral 101), each of the banks 0 . . . (N−1) of the DRAM chip architecture 100 are modified such that each bank has a split local data bus (LDQ) to allow doubling of prefetch width without doubling the number of lines in the LDQ.

Therefore, FIG. 1 shows a DRAM chip architecture with a plurality of banks, each of which has a number of sections. Each section is segmented into a plurality of array tiles.

Figure 2:
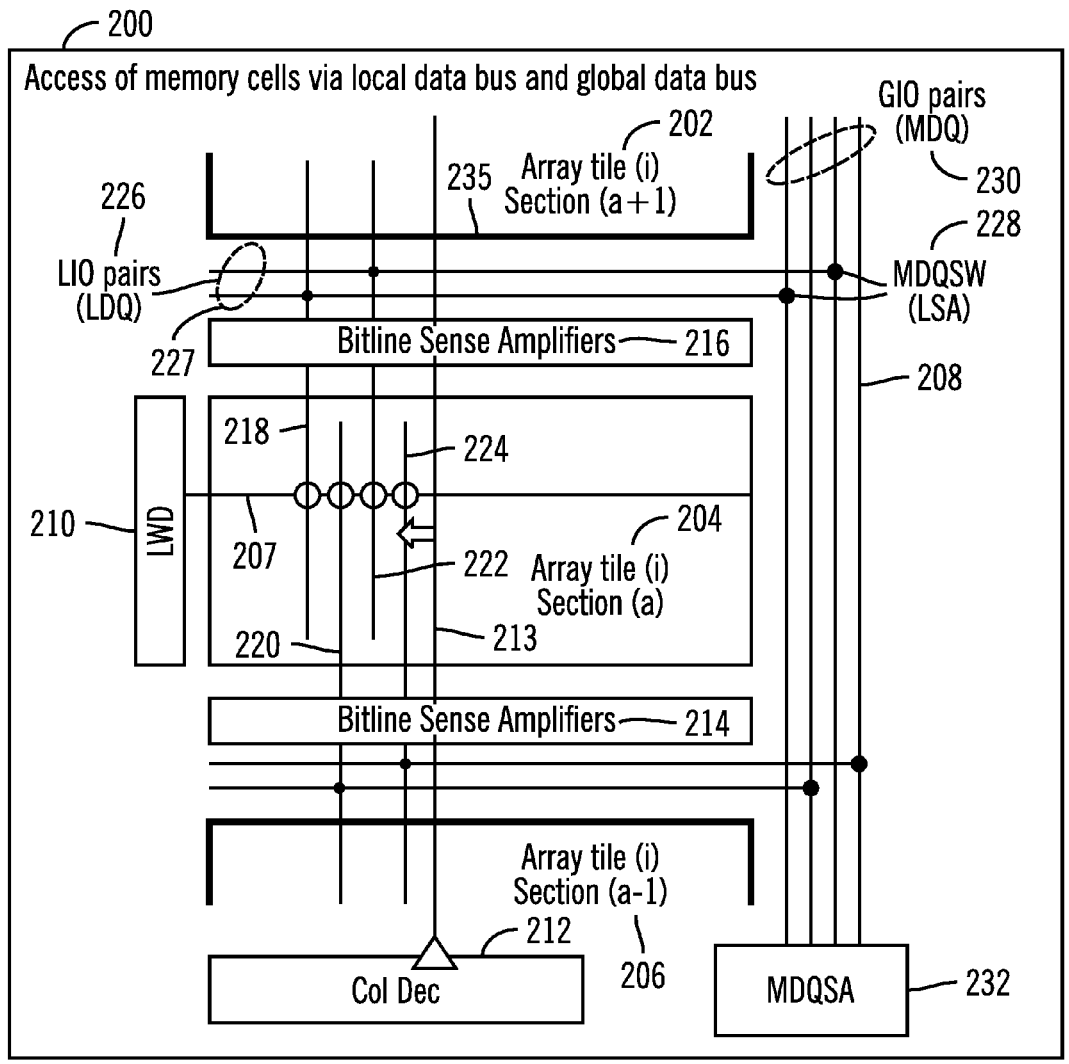
FIG. 2 illustrates a block diagram that shows access of memory cells via local data bus and global data bus, in accordance with certain embodiments.

FIG. 2 illustrates a block diagram 200 that shows access of memory cells via local data bus and global data bus, in accordance with certain embodiments. FIG. 2 shows array tile (i) (shown in FIG. 1 via reference numeral 122) of sections (a+1), a, and (a−1) via reference numerals 202, 204, 206. Thus in FIG. 2, the array tile (i) corresponding to three consecutive sections of a bank of the DRAM chip 102 are shown.

In FIG. 2, the horizontal lines show word lines and the vertical lines show bit lines. For example, reference numeral 207 shows an exemplary word line, and reference numeral 208 shows an exemplary bit line. In order to perform a prefetch, a local word line driver (LWD) 210 is activated and the column decoder 212 selects (via a column select line (CSL) 213) one or more bits from the word line.

The bitline sense amplifiers (BLSA) 214, 216 sense and amplify signals on the bit lines. Bitline sense amplifiers 216 are used in between section a and section (a+1), and bitline sense amplifiers 214 are used in between section (a−1) and section a. Bitline sense amplifiers, positioned above a section and a below a section, sense and amplify alternating bit lines. For example, if the bitline sense amplifiers 216 are used for even numbered bit lines, then the bitline sense amplifiers 214 are used for odd numbered bit lines. In FIG. 2, the bitline sense amplifiers 214 are used to sense and amplify signals in even numbered bit lines 220, 224 and the bitline sense amplifiers 216 are used to sense and amplify signals in odd numbered bit lines 218, 222. Each bitline sense amplifier is shared between two sections and if used for one section, the bitline sense amplifier is not used at the same time for another section.

When cells are sensed by bitline sense amplifiers, the sensed values are connected to a local data bus (LDQ or local data queue) 226 and then through switches, referred to as main data queue switch (MDQSW) 228, the sensed values are connected to the global data bus, referred to as main data queue (MDQ) 230. LDQ 226 may be referred to as local input/output (LIO) pair and the MDQ 230 may be referred to as global input/output (GIO) pair. The MSQSW 228 is shared by all sections whereas LDQ 226 is shared by two sections. The dotted oval 227 shows the two lines of the LDQ 226, where the two lines of the LDQ 226 are shared by section (a) and section (a+1), and the MDQSW 228 is shared by sections (a−1), section (a), section (a+1) and other sections not shown explicitly in FIG. 2.

Since the signals travel over long paths of the MDQ, main data queue sense amplifiers (MDQSA) 232 may be used to sense and amplify signals on the MDQ 230. Therefore, a local bus (shown via horizontal lines) is associated with each section and the MDQSW 228 determines, for the global data bus, where the signal is coming from.

Therefore, in FIG. 2, each array tile has a local word line driver. After a word line is activated, the column decoder 212 may trigger column select (CSL) to decide which bits should access the local IO bus (LDQ) 226. To pursue the smaller cell size, open-bitline architecture may be used in high-density memory cell array. There are two sets of BLSA 214, 216, one on the top and one at the bottom of a selected array tile. The horizontal LDQs are then connected to vertical global IO pairs (MDQ) 230 through the switches and local sense amplifiers referred to as MDQSW or LSA 228.

As illustrated in FIG. 2, to access 4 bits from an array tile uses 4 LDQ tracks (each track has two signal lines) and 4 MDQ tracks. In some architectures, the multiple MDQs may be allocated at both sides of the array tile or even stretch across two array tiles. However, the number of tracks is the same as shown in FIG. 2. It may be noted, that usually one column select operation selects 8 bits but for illustrative purposes FIG. 2 shows 4 bits being selected. Embodiments may use any number of bits for input/output.

Figure 3:
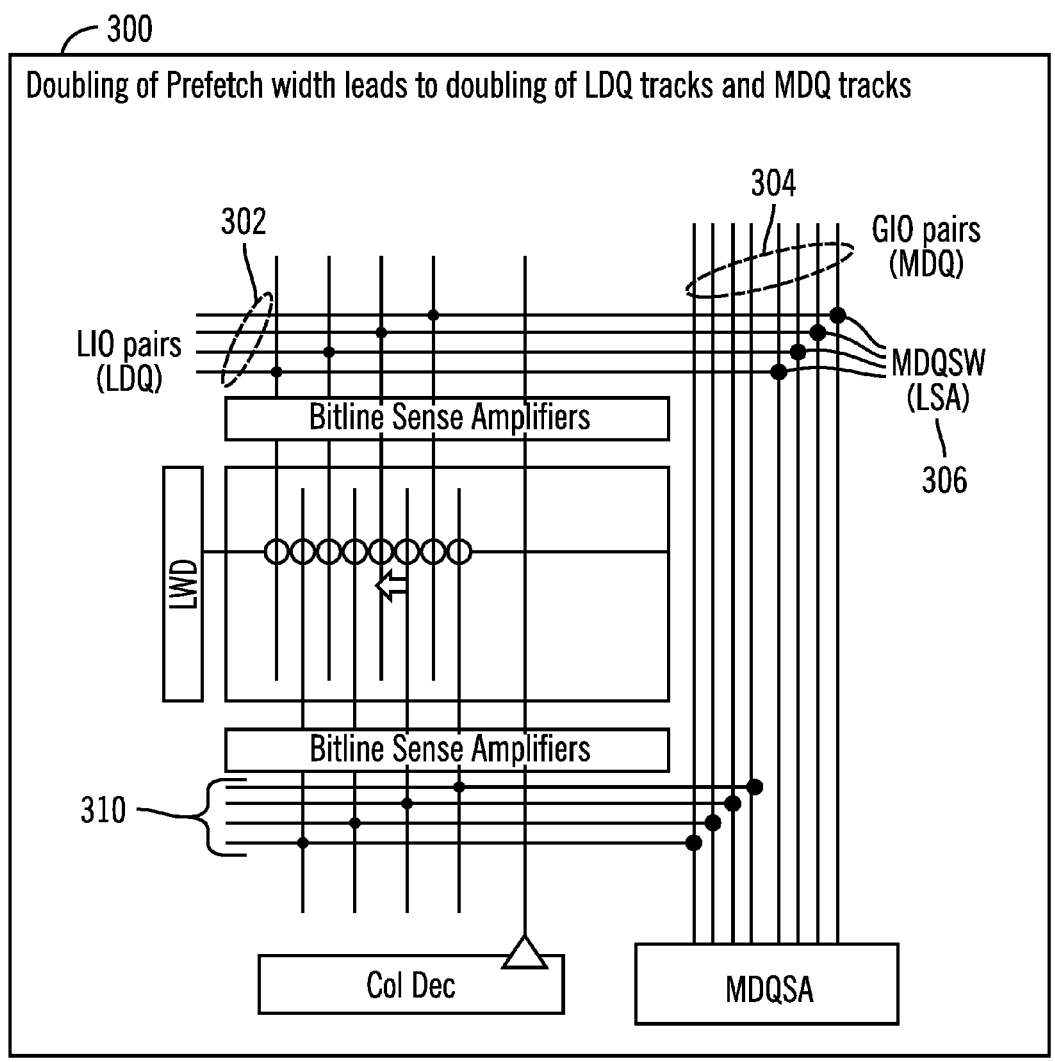
FIG. 3 illustrates a block diagram that shows that when prefetch width doubles then the number of local data bus tracks and the number of global data bus tracks double, in accordance with certain embodiments.

FIG. 3 illustrates a block diagram 300 that shows that when prefetch width doubles (in comparison to FIG. 2) then the number of LDQ tracks 302 and the number of MDQ tracks 304, and the number of MDQSWs 306 double, in accordance with certain embodiments. For example, it can be seen signals proceeds along the 4 tracks of the LDQ 302 (instead of the 2 tracks of the LDQ 226 in FIG. 2) as a result of the doubling of the prefetch width, and the doubling of the number of tracks of the LDQ to achieve the doubling of the prefetch width is not a desirable situation.

Figure 4:
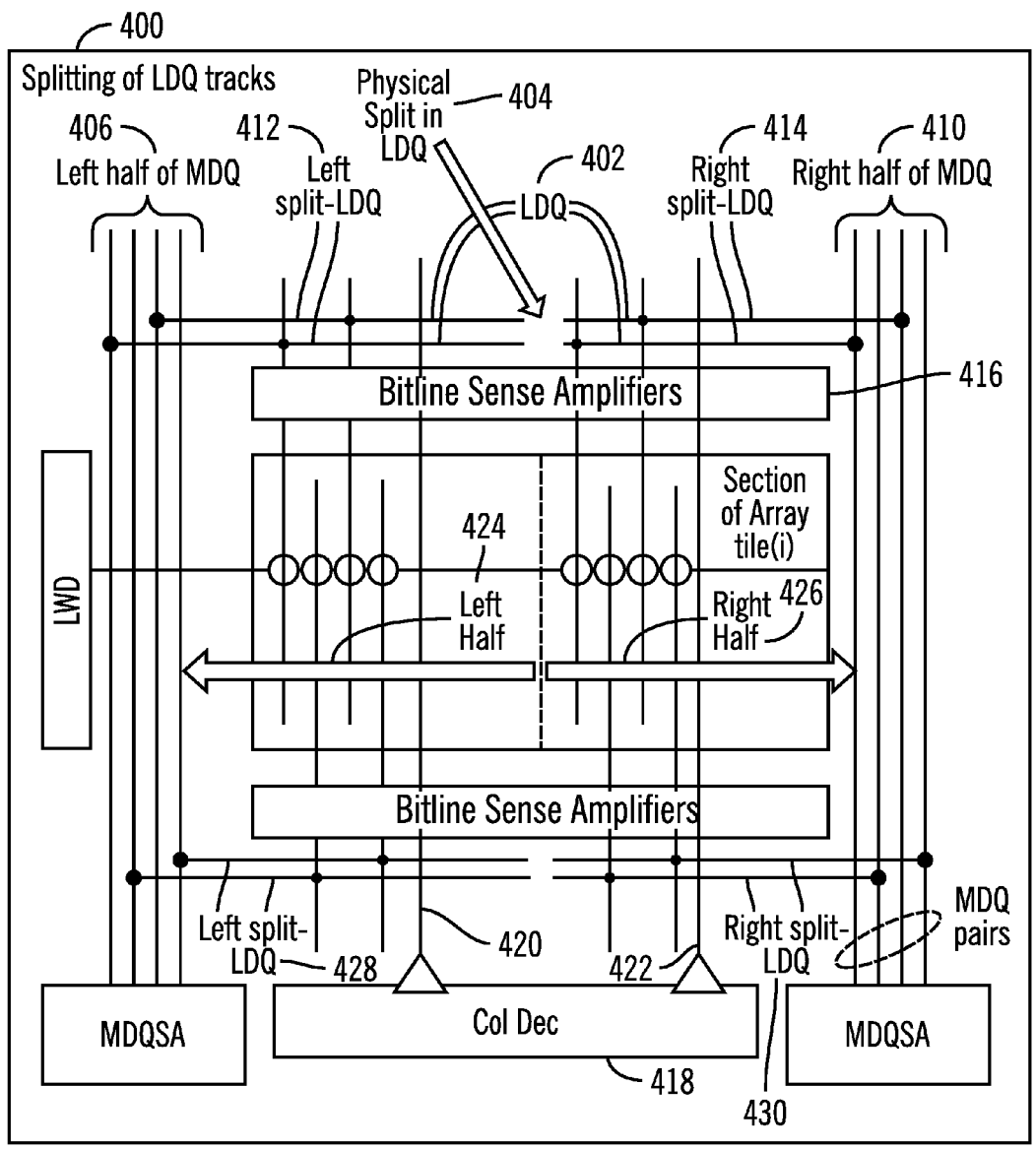
FIG. 4 illustrates a block diagram that shows a split local data bus, in which even if the prefetch width doubles, the number of local data bus tracks remain unchanged, in accordance with certain embodiments.

FIG. 4 illustrates a block diagram 400 that shows a split local data bus, in which even if the prefetch width doubles, the number of local data bus tracks remain unchanged, in accordance with certain embodiments.

In the architectures shown in FIGS. 2 and 3, an LDQ extends all the way from one end of an array tile to the other end of the array tile. In FIG. 4 the LDQ 402 is physically split (shown via the dark arrow indicated via reference numeral 404) in the middle, and one half of the MDQ lines are placed to the left (shown via reference numeral 406) of the array tile and the other half of the MDQ lines are placed to the right (shown via reference numeral 410) of the array tile. The left half of the LDQ that is referred to the left split-LDQ 412 connects to left MDQ 406, and right half of the LDQ that is referred to as the right split-LDQ 414 connects to right MDQ 410. Reference herein to half or halves can refer to a portion less than or greater than a half. The left and right halves can be other portions that add up to a whole. In the architecture shown in FIG. 4, when the left and right parts are halves, the average distance from the BLSA 416 to an MDQ line is halved in comparison to the architecture shown in FIG. 3.

In order to support the architecture shown in FIG. 4, data is read or written in parallel via the left split-LDQ 412 and the right split-LDQ 414. The column decoder 418 sends two sets of column select signals (CSL) 420, 422. Of the two sets of column select signals (CSL) 420, 422, one set is used to select data for transmission along the left split-LDQ 412 and the other set is used to select data for transmission along the right split-LDQ 414. For example, CSL signals 420 selects the left half 424 of the word lines and CSL signals 422 selects the right half 426 of the word lines.

Therefore, FIG. 4 illustrates certain embodiments in which by physically splitting the LDQ into two halves and sending data in parallel to through the two halves to MDQs placed on both sides of array tiles, the prefetch width may be doubled without increasing the number of LDQ tracks. It may be seen that 8 bits of data are transmitted via four local bus lines, where two bits are transmitted by the left-split LDQ 412, two bits by the right split-LDQ 414, two bits by the left-split LDQ 428, and two bits by the right split-LDQ 430, based on selections of the column decoder 418 via the CSLs 420, 422.

Figure 5:
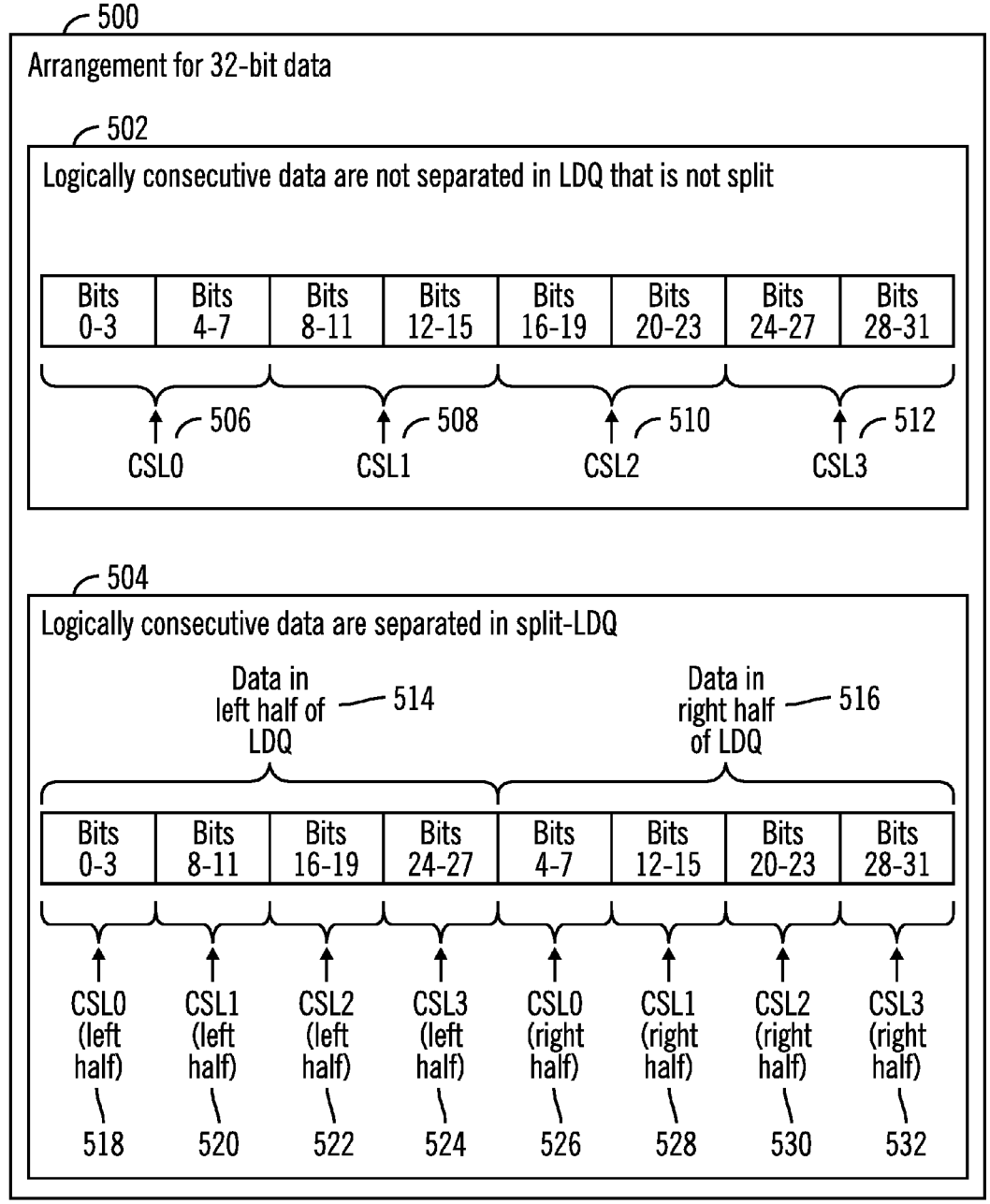
FIG. 5 illustrates a block diagram of a 32 bit data arrangement, in accordance with certain embodiments.

FIG. 5 illustrates a block diagram 500 of an arrangement for 32-bit data, in accordance with certain embodiments. Logically consecutive data are not separated in architectures in which the LDQ is not split (as shown via reference numeral 502). In the block shown via reference numeral 502, of the 32 bits of data (i.e., bits 0-31), the first byte comprising the first 8 bits (bits 0-7) are selected by column select line CSL0 506, the second byte comprising the next 8 bits (bits 8-15) are selected by column select line CSL1 508, the third byte comprising the next 8 bits (bits 16-23) are selected by column select line CSL2 510, and the fourth byte comprising the next 8 bits (bits 24-31) are selected by column select line CSL3 512, where CSL0 506, CSL1 508, CLS2 510, CSL3 512 are four column select lines of the LDQ, where the LDQ is not split. There is no need to separate contiguous bits of data if the LDQ is not split.

In certain embodiments that implement the split LDQ shown in FIG. 4, logically consecutive data are separated into physically two separate halves as indicated in the block shown via reference numeral 504. The first, third, fifth, and seventh nibbles comprising bits 0-3, bits 8-11, bits 16-19, and bits 24-27 of data respectively, are transmitted via the left half 514 of the split LDQ, and the second, fourth, sixth, and eight nibbles comprising bits 4-7, bits 12-15, bits 20-23, bits 28-31 respectively are transmitted via the right half 516 of the split LDQ.

For example, of the 32 bits of data, the first nibble (bits 0-3) is fetched from the left half 514 of the LDQ, by column select line CSL0 518 of the left half 514 of the LDQ, and the second nibble (bits 4-7) is fetched from the right half 516 of the LDQ by column select line CSL0 526 of the right half 516 of the LDQ. The third nibble (bits 8-11) is fetched from the left half 514 of the LDQ, by column select line CSL1 520 of the left half 514 of the LDQ, and the fourth nibble (bits 12-15) is fetched from the right half 516 of the LDQ by column select line CSL1 528 of the right half 516 of the LDQ. The fifth nibble (bits 16-19) is fetched from the left half 514 of the LDQ, by column select line CSL2 522 of the left half 514 of the LDQ, and the sixth nibble (bits 20-23) is fetched from the right half 516 of the LDQ by column select line CSL2 530 of the right half 516 of the LDQ. The seventh nibble (bits 24-27) is fetched from the left half 514 of the LDQ, by column select line CSL3 524 of the left half 514 of the LDQ, and the eighth nibble (bits 28-31) is fetched from the right half 516 of the LDQ by column select line CSL3 532 of the right half 516 of the LDQ.

Therefore, FIG. 5 shows certain embodiments in which logically consecutive data are separated to implement DRAM architectures in which the LDQ is physically split into two halves.

Therefore, certain embodiments shown in FIGS. 1-5 use a split local data bus to transmit data from the local data bus to the global data bus (e.g., MDQ). The bandwidth is increased by reducing the average distances from the bitline sense amplifiers to the global data bus by half, while at the same time transmitting data in parallel towards the left side of the split LDQ bus and towards to right side of the split LDQ bus, without increasing the number of local data bus lines. The overall DRAM floorplan architecture is not changed, except that the number of lines of the global data bus are doubled, in order to support double prefetch width. Thus double prefetch width is achieved without increasing the number of lines of the local data bus.

The described components and/or operations may be implemented as a method, apparatus or computer program product using standard programming and/or engineering techniques to produce software, firmware, hardware, or any combination thereof. The described operations may be implemented as code maintained in a "computer readable storage medium" for implementation in certain embodiments or for software simulation of a memory chip for design purposes, where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard drive drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of flowcharts and/or block diagrams may be implemented by computer program instructions.

Figure 6:
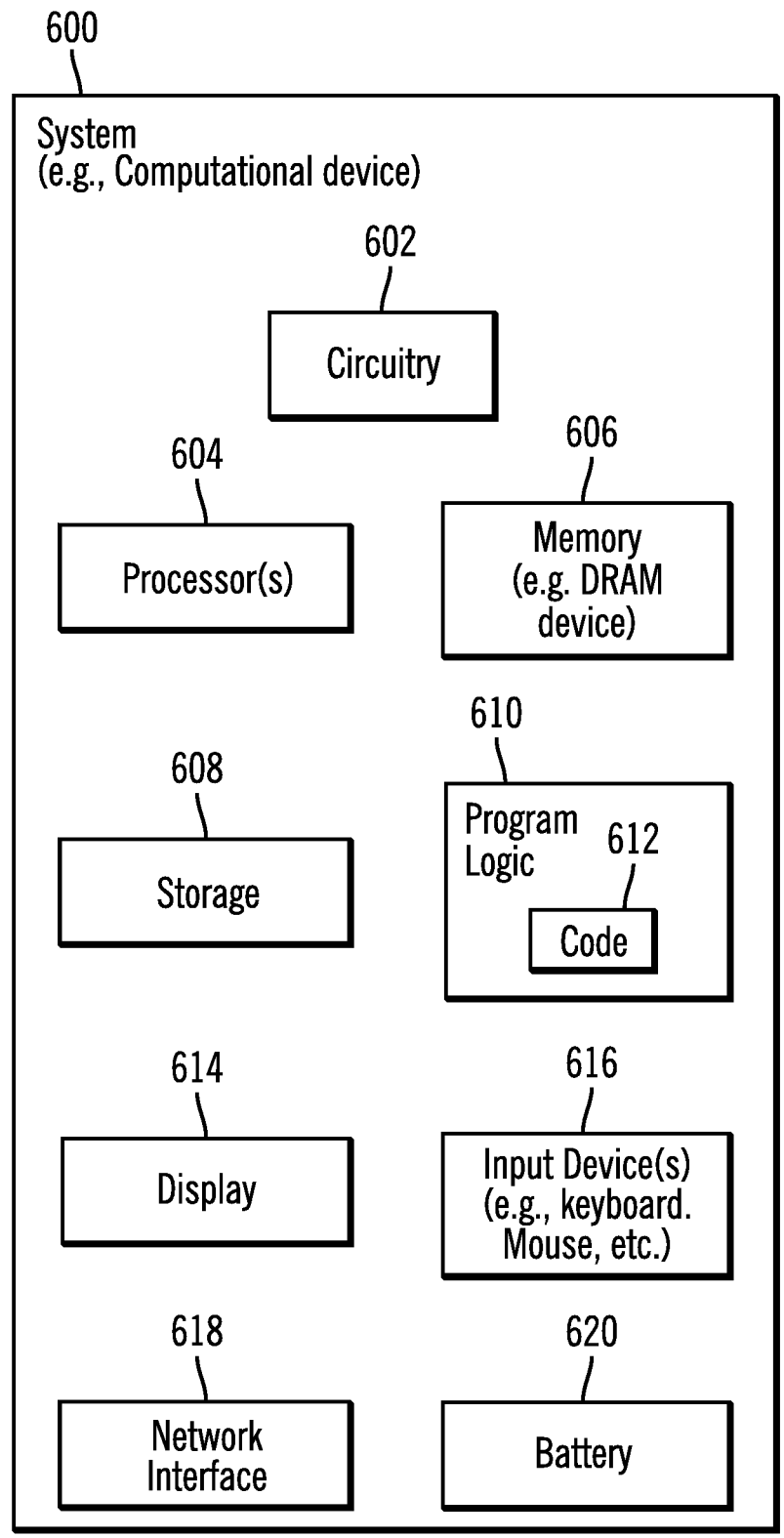
FIG. 6 illustrates a block diagram of a system including a computational device that includes a DRAM device, in accordance with certain embodiments.

FIG. 6 illustrates a block diagram of a system 600 that may include a computational device where a DRAM with a split LDQ is included in the computational device. For example, in certain embodiments the system 600 may be a computer (e.g., a laptop computer, a desktop computer, a tablet, a cell phone or any other suitable computational device) that has a DRAM device having the split LDQ (as shown in FIG. 4) in the computer. The system 600 may include a circuitry 602 that may in certain embodiments include at least a processor 604. The system 600 may also include a memory 606 (e.g., a DRAM having a split LDQ), and storage 608. The storage 608 may include a solid state drive, a disk drive, or other drives or devices including a non-volatile memory device (e.g., EEPROM, ROM, PROM, flash, firmware, programmable logic, etc.). The storage 608 may also include a magnetic disk drive, an optical disk drive, a tape drive, etc. The storage 608 may comprise an internal storage device, an attached storage device and/or a network accessible storage device. The system 600 may include a program logic 610 including code 612 that may be loaded into the memory 606 and executed by the processor 604 or circuitry 602. In certain embodiments, the program logic 610 including code 612 may be stored in the storage 608. In certain other embodiments, the program logic 610 may be implemented in the circuitry 602. Therefore, while FIG. 6 shows the program logic 610 separately from the other elements, the program logic 610 may be implemented in the memory 606 and/or the circuitry 602. The system 600 may also include a display 614 (e.g., an liquid crystal display (LCD), a light emitting diode (LED) display, a cathode ray tube (CRT) display, a touchscreen display, or any other suitable display). The system 600 may also include one or more input devices 616, such as, a keyboard, a mouse, a joystick, a trackpad, or any other suitable input devices). In certain embodiments, the display 614 may be coupled to a memory device comprising the storage 624 and/or the memory 606; a network interface 614 may be communicatively coupled to the processor 604; and a battery 620 may be communicatively coupled to the processor. Other components or devices beyond those shown in FIG. 6 may also be found in the system 600.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

Example 1 is a memory device, comprising a global data bus; and a local data bus split into two parts, wherein the local data bus is configurable to direct signals to the global data bus.

In example 2, the subject matter of example 1 further includes that the two parts of the local data bus comprise a first part and a second part, wherein the signals comprise a first signal and a second signal, wherein the first part of the local data bus is configurable to direct the first signal towards lines of the global data bus and wherein the second part of the local data bus is configurable to direct the second signal towards other lines of the global data bus.

In example 3, the subject matter of example 2 further includes that a width of the local data bus is half of a prefetch width of the memory device.

In example 4, the subject matter of example 3 further includes that the local data bus is configurable to separate logically consecutive data to direct the signals to the global data bus.

In example 5, the subject matter of example 4 further includes that the local data bus comprises an LDQ (local data queue) bus, wherein the global data bus comprises an MDQ (main data queue) bus, and wherein the memory device further comprises first column select lines that select values for the first part of the LDQ and second column select lines that select values for the second part of the LDQ.

In example 6, the subject matter of example 1 further includes that the memory device comprises at least one of a volatile or a nonvolatile memory device.

In example 7, the subject matter of example 1 further includes that the local data bus and the global data bus are included in a memory bank with a rectangular array of cells.

In example 8, the subject matter of example 1 further includes that the memory device comprises at least one memory bank.

Example 9 is a method, comprising: receiving signals in a local data bus that is split into two parts; and directing the signals from the local data bus to the global data bus.

In example 10, the subject matter of example 9 further includes that the two parts of the local data bus comprise a first part and a second part, wherein the signals comprise a first signal and a second signal, the method further comprising: configuring the first part of the local data bus to direct the first signal towards lines of the global data bus; configuring the second part of the local data bus to direct the second signal towards other lines of the global data bus.

In example 11, the subject matter of example 10 further includes that a width of the local data bus is half of a prefetch width.

In example 12, the subject matter of example 11 further includes that method further comprises: separating logically consecutive data in the local data bus while directing the signals to the global data bus.

In example 13, the subject matter of example 12 further includes that the local data bus is a LDQ (local data queue) bus, wherein the global data bus is a MDQ (main data queue) bus, and wherein the memory device further comprises first column select lines that select values for the first part of the LDQ and second column select lines that select values for the second part of the LDQ.

In example 14, the subject matter of example 9 further includes that the local data bus and the global data bus are included in memory device that comprises at least one of a volatile or a nonvolatile memory device.

In example 15, the subject matter of example 14 further includes that the memory device comprises at least one memory bank.

In example 16, the subject matter of example 9 further includes that the local data bus and the global data bus are included in a memory bank with a rectangular array of cells.

Example 17 is a computational device, comprising: a processor; and a memory device coupled to the processor, the memory device comprising: a global data bus; and a local data bus split into two parts, wherein the local data bus is configurable to direct signals to the global data bus.

In example 18, the subject matter of example 17 further includes that the two parts of the local data bus comprise a first part and a second part, wherein the signals comprise a first signal and a second signal, wherein the first part of the local data bus is configurable to direct the first signal towards lines of the global data bus and wherein the second part of the local data bus is configurable to direct the second signal towards other lines of the global data bus.

In example 19, the subject matter of example 18 further includes that a width of the local data bus is half of a prefetch width of the memory device.

In example 20, the subject matter of example 19 further includes that the local data bus is configurable to separate logically consecutive data to direct the signals to the global data bus.

In example 21, the subject matter of example 20 further includes that the local data bus comprises an LDQ (local data queue) bus, wherein the global data bus comprises an MDQ (main data queue) bus, and wherein the memory device further comprises first column select lines that select values for the first part of the LDQ and second column select lines that select values for the second part of the LDQ.

In example 22, the subject matter of example 17 further includes that local data bus and the global data bus are in a memory device that comprises at least one of a volatile or a nonvolatile memory device.

In example 23, the subject matter of example 22 further includes that the local data bus and the global data bus are included in a memory bank with a rectangular array of cells.

In example 24, the subject matter of example 17 further includes that the memory device comprises at least one memory bank.

In example 25, the subject matter of example 17 further includes that the computational device further comprises one or more of a display coupled to the memory device; a network interface communicatively coupled to the processor; or a battery communicatively coupled to the processor.

Example 26 is a memory device for sharing of data path, comprising a global data bus; and a local data bus split into two parts, wherein the local data bus is configurable to direct signals to the global data bus.

In example 27, the subject matter of example 26 further includes that the two parts of the local data bus comprise a first part and a second part, wherein the signals comprise a first signal and a second signal, wherein the first part of the local data bus is configurable to direct the first signal towards lines of the global data bus and wherein the second part of the local data bus is configurable to direct the second signal towards other lines of the global data bus.

In example 28, the subject matter of example 27 further includes that a width of the local data bus is half of a prefetch width of the memory device.

In example 29, the subject matter of example 28 further includes that the local data bus is configurable to separate logically consecutive data to direct the signals to the global data bus.

In example 30, the subject matter of example 29 further includes that the local data bus comprises an LDQ (local data queue) bus, wherein the global data bus comprises an MDQ (main data queue) bus, and wherein the memory device further comprises first column select lines that select values for the first part of the LDQ and second column select lines that select values for the second part of the LDQ.

In example 31, the subject matter of example 26 further includes that the memory device comprises at least one of a volatile or a nonvolatile memory device.

In example 32, the subject matter of example 26 further includes that the local data bus and the global data bus are included in a memory bank with a rectangular array of cells.

In example 33, the subject matter of example 26 further includes that the memory device comprises at least one memory bank.

Example 34 is a method for sharing of data path, comprising: receiving signals in a local data bus that is split into two parts; and directing the signals from the local data bus to the global data bus.

In example 35, the subject matter of example 34 further includes that the two parts of the local data bus comprise a first part and a second part, wherein the signals comprise a first signal and a second signal, the method further comprising: configuring the first part of the local data bus to direct the first signal towards lines of the global data bus; configuring the second part of the local data bus to direct the second signal towards other lines of the global data bus.

In example 36, the subject matter of example 35 further includes that a width of the local data bus is half of a prefetch width.

In example 37, the subject matter of example 36 further includes that method further comprises: separating logically consecutive data in the local data bus while directing the signals to the global data bus.

In example 38, the subject matter of example 37 further includes that the local data bus is a LDQ (local data queue) bus, wherein the global data bus is a MDQ (main data queue) bus, and wherein the memory device further comprises first column select lines that select values for the first part of the LDQ and second column select lines that select values for the second part of the LDQ.

In example 39, the subject matter of example 34 further includes that the local data bus and the global data bus are included in memory device that comprises at least one of a volatile or a nonvolatile memory device.

In example 40, the subject matter of example 39 further includes that the memory device comprises at least one memory bank.

In example 41, the subject matter of example 34 further includes that the local data bus and the global data bus are included in a memory bank with a rectangular array of cells.

Example 42 is a computational device for sharing of data path, comprising: a processor; and a memory device coupled to the processor, the memory device comprising: a global data bus; and a local data bus split into two parts, wherein the local data bus is configurable to direct signals to the global data bus.

In example 43, the subject matter of example 42 further includes that the two parts of the local data bus comprise a first part and a second part, wherein the signals comprise a first signal and a second signal, wherein the first part of the local data bus is configurable to direct the first signal towards lines of the global data bus and wherein the second part of the local data bus is configurable to direct the second signal towards other lines of the global data bus.

In example 44, the subject matter of example 43 further includes that a width of the local data bus is half of a prefetch width of the memory device.

In example 45, the subject matter of example 44 further includes that the local data bus is configurable to separate logically consecutive data to direct the signals to the global data bus.

In example 46, the subject matter of example 45 further includes that the local data bus comprises an LDQ (local data queue) bus, wherein the global data bus comprises an MDQ (main data queue) bus, and wherein the memory device further comprises first column select lines that select values for the first part of the LDQ and second column select lines that select values for the second part of the LDQ.

In example 47, the subject matter of example 42 further includes that local data bus and the global data bus are in a memory device that comprises at least one of a volatile or a nonvolatile memory device.

In example 48, the subject matter of example 47 further includes that the local data bus and the global data bus are included in a memory bank with a rectangular array of cells.

In example 49, the subject matter of example 42 further includes that the memory device comprises at least one memory bank.

In example 50, the subject matter of example 42 further includes that the computational device further comprises one or more of a display coupled to the memory device; a network interface communicatively coupled to the processor; or a battery communicatively coupled to the processor.

Example 51 is a system for sharing of data path, the system comprising: means for receiving signals in a local data bus that is split into two parts; and means for directing the signals from the local data bus to the global data bus.

In example 52, the subject matter of example 51 further includes that the two parts of the local data bus comprise a first part and a second part, wherein the signals comprise a first signal and a second signal, and the system further comprises: means for configuring the first part of the local data bus to direct the first signal towards lines of the global data bus; and means for configuring the second part of the local data bus to direct the second signal towards other lines of the global data bus.

In example 53, the subject matter of example 52 further includes that a width of the local data bus is half of a prefetch width.

In example 54, the subject matter of example 53 further includes that the system further comprises: means for separating logically consecutive data in the local data bus while directing the signals to the global data bus.

In example 55, the subject matter of example 54 further includes that the local data bus is a LDQ (local data queue) bus, wherein the global data bus is a MDQ (main data queue) bus, and wherein the memory device further comprises first column select lines that select values for the first part of the LDQ and second column select lines that select values for the second part of the LDQ.

In example 56 the subject matter of example 51 further includes that the local data bus and the global data bus are included in memory device that comprises at least one of a volatile or a nonvolatile memory device.

In example 57, the subject matter of example 56 further includes that the memory device comprises at least one memory bank.

In example 58, the subject matter of example 51 further includes that the local data bus and the global data bus are included in a memory bank with a rectangular array of cells.

What is claimed is:

1. A memory device, comprising:
    a global data bus comprising a first set of lines and a second set of lines;
    a local data bus split into a first part and a second part; and
    a decoder configurable to transmit a first set of signals via a first set of column select lines to select data for transmission along the first part of the local data bus to the first set of lines of the global data bus, and a second set of signals via a second set of column select lines to select data for transmission along the second part of the local data bus to the second set of lines of the global data bus.

2. The memory device of claim 1, wherein a width of the local data bus is half of a prefetch width of the memory device.

3. The memory device of claim 2, wherein the local data bus is configurable to separate logically consecutive data for directing data to the global data bus.

4. The memory device of claim 1, wherein the memory device comprises at least one of a volatile or a nonvolatile memory device.

5. The memory device of claim 1, wherein the memory device comprises at least one memory bank.

6. A method, comprising:
    receiving signals in a local data bus that is split into a first part and a second part;
    directing the signals from the local data bus to a global data bus comprising a first set of lines and a second set of lines; and
    transmitting, by a decoder, a first set of signals via a first set of column select lines to select data for transmission along the first part of the local data bus to the first set of lines of the global data bus, and a second set of signals via a second set of column select lines to select data for transmission along the second part of the local data bus to the second set of lines of the global data bus.

7. The method of claim 6, wherein a width of the local data bus is half of a prefetch width.

8. The method of claim 7, the method further comprising:
separating logically consecutive data in the local data bus for directing data to the global data bus.

9. The method of claim 6, wherein the local data bus and the global data bus are included in memory device that comprises at least one of a volatile or a nonvolatile memory device.

10. The method of claim 9, wherein the volatile or the nonvolatile memory device comprises at least one memory bank.

11. A computational device, comprising:
a processor; and
a memory device coupled to the processor, the memory device comprising:
a global data bus comprising a first set of lines and a second set of lines;
a local data bus split into a first part and a second part and
a decoder configurable to transmit a first set of signals via a first set of column select lines to select data for transmission along the first part of the local data bus to the first set of lines of the global data bus, and a second set of signals via a second set of column select lines to select data for transmission along the second part of the local data bus to the second set of lines of the global data bus.

12. The computational device of claim 11, wherein a width of the local data bus is half of a prefetch width of the memory device.

13. The computational device of claim 12, wherein the local data bus is configurable to separate logically consecutive data for directing data to the global data bus.

14. The computational device of claim 11, wherein local data bus and the global data bus are in a memory device that comprises at least one of a volatile or a nonvolatile memory device.

15. The computational device of claim 11, wherein the memory device comprises at least one memory bank.

16. The computational device of claim 11, comprising one or more of:

a display coupled to the memory device;
a network interface communicatively coupled to the processor; or
a battery communicatively coupled to the processor.

17. The memory device of claim 1, wherein the first set of signals select one half of a word line, and wherein the second set of signals select another half of the word line.

18. The memory device of claim 1, wherein the first part of the local data bus and the second part of the local data bus are both located in between the first set of lines and the second set of lines of the global data bus.

19. The memory device of claim 1, wherein a first section and a second section of an array tile are located in between the first set of lines of the global data bus and the second set of lines of the global data bus, and wherein the local data bus is located in between the first section and the second section of the array tile.

20. The method of claim 6, wherein the first set of signals select one half of a word line, and wherein the second set of signals select another half of the word line.

21. The method of claim 6, wherein the first part of the local data bus and the second part of the local data bus are both located in between the first set of lines and the second set of lines of the global data bus.

22. The method of claim 6, wherein a first section and a second section of an array tile are located in between the first set of lines of the global data bus and the second set of lines of the global data bus, and wherein the local data bus is located in between the first section and the second section of the array tile.

23. The computational device of claim 11, wherein the first set of signals select one half of a word line, and wherein the second set of signals select another half of the word line.

24. The computational device of claim 11, wherein the first part of the local data bus and the second part of the local data bus are both located in between the first set of lines and the second set of lines of the global data bus.

25. The computational device of claim 11, wherein a first section and a second section an array tile are located in between the first set of lines of the global data bus and the second set of lines of the global data bus, and wherein the local data bus is located in between the first section and the second section of the array tile.

* * * * *